United States Patent [19]

Yamazaki

[11] Patent Number: 5,391,893
[45] Date of Patent: * Feb. 21, 1995

[54] NONSINGLE CRYSTAL SEMICONDUCTOR AND A SEMICONDUCTOR DEVICE USING SUCH SEMICONDUCTOR

[75] Inventor: Shunpei Yamazaki, Tokyo, Japan

[73] Assignee: Semicoductor Energy Laboratory Co., Ltd., Kanagawa, Japan

[*] Notice: The portion of the term of this patent subsequent to Aug. 27, 2008 has been disclaimed.

[21] Appl. No.: 694,406

[22] Filed: May 1, 1991

Related U.S. Application Data

[63] Continuation-in-part of Ser. No. 860,441, May 7, 1986, Pat. No. 5,043,772, which is a continuation-in-part of Ser. No. 800,694, Nov. 22, 1985, Pat. No. 4,690,717.

[30] Foreign Application Priority Data

May 7, 1985 [JP] Japan ................... 60-96391
May 7, 1985 [JP] Japan ................... 60-96392

[51] Int. Cl.$^6$ ............... H01L 29/78; H01L 29/04
[52] U.S. Cl. .................... 257/52; 257/65; 257/57; 257/66
[58] Field of Search ............ 357/4, 52, 2, 23.7

[56] References Cited

U.S. PATENT DOCUMENTS

| 4,053,335 | 10/1977 | Hu ........................ 357/52 |
|---|---|---|
| 4,091,407 | 5/1978 | Williams ................ 357/54 |
| 4,469,568 | 9/1984 | Kato et al. . | |
| 4,667,214 | 5/1987 | Sekimura et al. ....... 357/4 |

FOREIGN PATENT DOCUMENTS 2130008 5/1984 United Kingdom .......... 357/4

OTHER PUBLICATIONS

Schmidt P. F., *J. Electrochem. Soc.: Solid-State Science And Technology* Jan. 1983 pp. 196–199. "Contamination-Free . . . Materials."

Primary Examiner—Jerome Jackson
Attorney, Agent, or Firm—Sixbey, Friedman, Leedom & Ferguson; Gerald J. Ferguson, Jr., Joan K. Lawrence

[57] ABSTRACT

A semiconductor device including a conductive substrate or a first conductive layer formed on the substrate, a non-single-crystal semiconductor layer member is disposed on the conductive substrate or the conductive layer, the non-single-crystal semiconductor layer member having at least one intrinsic, non-single-crystal semiconductor layer, and a second conductive layer disposed on the non-single-crystal semiconductor layer. The intrinsic non-single-crystal semiconductor layer contains sodium and oxygen in very low concentrations where each concentration is $5 \times 10^{18}$ atoms/cm$^3$ or less.

19 Claims, 7 Drawing Sheets

NONSINGLE CRYSTAL SEMICONDUCTOR AND A SEMICONDUCTOR DEVICE USING SUCH SEMICONDUCTOR

RELATED APPLICATIONS

This application is continuation-in-part of co-pending application Ser. No. 860,441, filed May 7, 1986, now U.S. Pat. No. 5,043,772, which in turn is a continuation-in-part of application Ser. No. 800,694, filed Nov. 22, 1985, now U.S. Pat. No. 4,690,717. This application is also related to application Ser. No. 525,459, filed Aug. 22, 1983, now U.S. Pat. No. 4,591,892.

BACKGROUND OF THE INVENTION

1. Field of the Invention

The present invention relates to improvements in or relating to a semiconductor photo-electrically-sensitive device which has at least a non-single-crystal semiconductor layer member having at least one intrinsic non-single-crystal semiconductor layer.

2. Description of the Prior Art

Heretofore there have been proposed a variety of semiconductor photo-electrically-sensitive devices of the type that have at least one non-single-crystal semiconductor layer member having at least one intrinsic non-single-crystal semiconductor layer.

In the semiconductor photo-electrically-sensitive device of such a structure, the intrinsic non-single-crystal semiconductor layer presents photo-conductivity corresponding to the intensity of incident light. Usually, the intrinsic non-single-crystal semiconductor layer contains hydrogen or a halogen as a recombination center neutralizer for neutralization of recombination centers which would otherwise exist in large quantities since the intrinsic non-single-crystal semiconductor layer is formed of a non-single-crystal semiconductor. This prevents the photo-sensitivity of the intrinsic non-single-crystal semiconductor layer from being lowered by recombination centers.

The photo-sensitivity of the conventional semiconductor photo-electrically-sensitive device of this kind is very low and readily changes with intensity of incident light or temperature.

As a result of various experiments, the present inventor has found that one of the reasons for the low photo-sensitivity and its instability is that in the case where the intrinsic non-single-crystal semiconductor layer of the non-single-crystal semiconductor layer member is formed inevitably containing sodium as an impurity, the sodium content is as large as $10^{20}$ atoms/cm$^3$ or more.

Moreover, the present inventor has found that such a large sodium content lowers the photo-sensitivity of the semiconductor photo-electrically-sensitive device and gives rise to the instability of the photosensitivity for the following reasons:

In a case where the intrinsic non-single-crystal semiconductor layer contains sodium in as high a concentration as $10^{20}$ atoms/cm$^3$ or more, a large number of clusters of sodium are created in the intrinsic non-single-crystal semiconductor layer and these clusters of sodium serve as recombination centers of photo carriers. Accordingly, when the sodium content is large as mentioned above, the intrinsic non-single-crystal semiconductor layer contains a number of recombination centers of photo carriers which are not neutralized by a recombination center neutralizer. Consequently, photo carriers which are generated by the incidence of light in the intrinsic non-single-crystal semiconductor layer are recombined with the recombination centers, resulting in a heavy loss of the photo carriers. Further, the intrinsic non-single-crystal semiconductor layer, when containing sodium, creates dangling bonds of sodium, which serve as donor centers. In the case where the intrinsic non-single-crystal semiconductor layer contains sodium in as high a concentration as $10^{20}$ atoms/cm$^3$ or more, it contains many dangling bonds of sodium acting as donor centers. In this case, the center level of the energy band in the widthwise direction thereof in the intrinsic non-single-crystal semiconductor layer relatively greatly deviates further to the valence band than the Fermi level. Accordingly, the photosensitivity of the intrinsic non-single-crystal semiconductor layer depending upon the intensity of light is very low and changes with the intensity of the incident light or temperature. Further, the diffusion length of holes of the photo carriers in the intrinsic non-single-crystal semiconductor layer is short.

Moreover, the sodium contained in the intrinsic non-single-crystal semiconductor layer is combined with the material forming the layer. For instance, when the layer is formed of silicon, it has a combination expressed by the general formula Si-Na-Si. Accordingly, when the sodium content is as large as $10^{20}$ atoms/cm$^3$ or more, the layer contains the combination of the material forming the layer and the sodium in large quantities.

The combination of the material forming the intrinsic non-single-crystal semiconductor layer and the sodium contained therein is decomposed by the incident light to create in the layer dangling bonds of the material forming it and dangling bonds of the sodium.

Therefore, in the case where the intrinsic non-single-crystal semiconductor layer contains sodium in as high a concentration as $10^{20}$ atoms/cm$^3$ or more, the dangling bonds of the material forming the layer and the dangling bonds of sodium which are generated in the layer, will be greatly increased by the incident light. In such a case, the dangling bonds of the material forming the layer act as recombination centers of the photo carriers, and the loss of the photo carriers generated in the layer increases. As the dangling bonds of the sodium increase, the center level of the energy band in the widthwise direction thereof, which has greatly deviated further to the valence band than the Fermi level, further deviates toward the valence band correspondingly, resulting in marked reduction of the photo carrier generating efficiency of the intrinsic non-single-crystal semiconductor layer. Also the diffusion length of holes of the photo carriers in the intrinsic non-single-crystal semiconductor layer is further reduced, markedly raising the dark conductivity of the layer.

In a state in which the photo carrier generating efficiency of the intrinsic non-single-crystal semiconductor layer has thus been lowered and the loss of the photo carriers in the layer and the dark conductivity of the layer have thus been increased, if the layer is heated, the dangling bonds of the material forming the layer and the dangling bonds of sodium, generated in large quantities in the layer, will be partly combined with each other to re-form the combination of the material forming the layer and the sodium. As a result, both the dangling bonds of the material forming the layer and the sodium content will be decreased. In the intrinsic non-single-crystal semiconductor layer, however, the dangling bonds of the material forming the layer and the dangling bonds of sodium still remain in large quantities. Consequently, the photo carrier generating efficiency of the intrinsic non-single-crystal semiconductor layer is very low to impose a loss on the photo carriers in the layer, and the dark conductivity of the layer is extremely high. In addition, the photo carrier generating efficiency, the photoconductivity, the loss of photo carriers and the dark conductivity of the intrinsic non-single-crystal semiconductor layer, and accordingly the photo-sensitivity of the layer largely differ before and after heating.

The above is the reason found by the present inventor for which the photo-sensitivity of the conventional semiconductor photo-electrically-sensitive device is low and readily varies with the intensity of incident light or temperature when the intrinsic non-single-crystal semiconductor contains sodium in as high a concentration as $10^{20}$ atoms/cm$^3$ or more.

Further, the present inventor has also found that when the contains oxygen in as high a concentration as $10^{20}$ atoms/cm$^3$ or more, the photo-sensitivity of the conventional semiconductor photo-electrically-sensitive device is very low and fluctuates with the intensity with the incidence light or temperature for the following reason:

When the intrinsic non-single-crystal semiconductor layer contains oxygen in as high a concentration as $10^{20}$ atoms/cm$^3$ as referred to previously, the layer forms therein a number of clusters of oxygen. The clusters of oxygen act as combination centers of photo carriers as is the case with the clusters of sodium. Further, the intrinsic non-single-crystal semiconductor layer, when containing oxygen in such a high concentration as $10^{20}$ atoms/cm$^3$, the layer contains dangling bonds of oxygen acting as donor centers and the combination of the material forming the layer and oxygen in large quantities. The combination of the material forming the layer and oxygen is decomposed by the incident light to create in the layer dangling bonds of the material forming it and dangling bonds of the oxygen. If the layer is heated, the dangling bonds of the material forming the layer and the dangling bonds of oxygen will be decreased small quantities but remain in the layer in large quantities.

The above is the reason found by the present inventor for which the photo-sensitivity of the conventional semiconductor photoelectric conversion device is very low and varies with the intensity of the incident light or temperature when the intrinsic non-single-crystal semiconductor layer contains oxygen in as high a concentration as $10^{20}$ atoms/cm$^3$ or more.

Moreover, the present inventor has found that when the intrinsic non-single-crystal semiconductor layer contains sodium and oxygen each in as high a concentration as $10^{20}$ atoms/cm$^3$ or more, too, the photo-sensitivity of the conventional semiconductor photo-electrically-sensitive device is very low and varies with the intensity of the incident light or temperature. The reason therefor will be apparent from the previous discussions.

SUMMARY OF THE INVENTION

It is therefore an object of the present invention to provide a novel semiconductor photo-electrically-sensitive device which is provided with at least a non-single-crystal semiconductor layer member having at least one intrinsic non-single-crystal semiconductor layer and whose photo-sensitivity is far higher and much less variable with the intensity of incident light or temperature than that of the conventional semiconductor photo-electrically-sensitive devices of the above said construction.

In accordance with an aspect of the present invention, even if the intrinsic non-single-crystal semiconductor layer of the non-single-crystal semiconductor layer member is inevitably formed containing sodium singly, or sodium and oxygen as impurities, the sodium or sodium and oxygen contents are each as low as $5 \times 10^{18}$ atoms/cm$^3$ or less.

Therefore, the photo-sensitivity of the semiconductor photo-electrically-sensitive device of the present invention is far higher and much less variable with the intensity of incident light or temperature than is conventional for the semiconductor photo-electrically-sensitive devices of this kind.

For the following reason ascertained by the present inventor for the first time, the photo-electrically-sensitive device of the present invention in the case of the sodium content being $5 \times 10^{18}$ atoms/cm$^3$ or less is far higher and much less variable with the intensity of the incident light or temperature than the photo-sensitivity of the conventional photo-electrically-sensitive device in the case of the sodium content being $10^{20}$ atoms/cm$^3$ or more as described previously.

When the sodium content of the intrinsic non-single-crystal semiconductor layer is $5 \times 10^{18}$ atoms/cm$^3$ or less, there is formed in the layer substantially no or a very small number of clusters of sodium which act as recombination centers of photo carriers. Accordingly, the intrinsic non-single-crystal semiconductor layer has substantially no or a very small number of recombination centers of photo carriers based on sodium. This means that substantially no or a very small of loss is imposed on the photo carriers that are created in the intrinsic non-single-crystal semiconductor layer.

With the above sodium content in the intrinsic non-single-crystal semiconductor layer, the number of dangling bonds of sodium contained in the layer is very small, even if contained. In this instance, the center level of the energy band in the widthwise direction of the intrinsic non-single-crystal semiconductor layer hardly deviates from the Fermi level and even if it deviates, the amount of deviation is very small. Consequently, the photo carrier generating efficiency is far higher than is obtainable with the conventional semiconductor photo-electrically-sensitive device in which the sodium content of the intrinsic non-single-crystal semiconductor layer is $10^{20}$ atoms/cm$^3$ or more, and the dark conductivity of the layer is far lower than in the case of the prior art device.

Further, when the sodium content in the intrinsic non-single-crystal semiconductor layer is $5 \times 10^{18}$ atoms/cm$^3$ or less, even if the layer contains combinations of the material forming the layer and the sodium, the number of such combinations is very small. Accordingly, dangling bonds of the material forming the layer and sodium are not substantially formed by the light irradiation of the semiconductor photo-electrically-sensitive device and, even if they are formed, their numbers are very small. Moreover, even if the device is heated, the dangling bonds of the layer material and to sodium will not increase. The photo carrier generating efficiency, the photo conductivity and the dark conductivity and accordingly the photo-sensitivity of the layer will remain substantially unchanged before and after irradiation by light and after heating.

For the reasons given above, when the sodium content in the intrinsic non-single-crystal semiconductor layer is $5 \times 10^{18}$ atoms/cm$^3$ or less, the semiconductor photo-electrically-sensitive device of the present invention exhibits a far higher and stable photosensitivity than the conventional semiconductor photo-electrically-sensitive device in which the sodium content in the intrinsic non-single-crystal semiconductor layer is $10^{20}$ atoms/cm$^3$ or more.

For the same reasons as mentioned above, the photosensitivity of the photo-electrically-sensitive device of the present invention in the case of the oxygen content being $5 \times 10^{18}$ atoms/cm$^3$ or less is far higher and much less variable with the intensity of incident light or temperature than the photosensitivity of the photo-electrically-sensitive device in the case of the oxygen content being $10^{20}$ atoms/cm$^3$ or more as described previously. Therefore, no detail description will be given thereof.

Additionally, the reason for which the photosensitivity of the photo-electrically-sensitive device in the case of the sodium and oxygen contents each being $5 \times 10^{15}$ atoms/cm$^3$ or less is far higher and much less variable with the intensity of incident light or temperature than the photo-sensitivity of the photo-electrically-sensitive device in the case of the sodium and oxygen contents each being $10^{20}$ atoms/cm$^3$ or more as referred to previously is the same reason as mentioned above. Therefore, no detail description will be given thereof.

The semiconductor material formed in accordance with the present invention is applicable not only to photoelectric conversion devices, but also to other semiconductor devices which utilize an intrinsic or substantially intrinsic non-single crystalline semiconductor layer.

Other objects, features and advantages of the present invention will become more fully apparent from the following detailed description taken in conjunction with the accompanying drawings.

DESCRIPTION OF THE PREFERRED EMBODIMENTS

FIGS. 1, 2, 3 and 4 illustrate first, second, third and fourth embodiments of the semiconductor photo-electrically-sensitive devices to which the present invention is applicable.

The first embodiment of the semiconductor photo-electrically-sensitive device shown in FIG. 1 has such a construction as follows:

A light transparent insulating substrate 1 has conductive layer 2 and 3 of, for example, tin oxide. The light transparent substrate 1 is made of glass, fused quartz, synthetic quartz, or the like.

On the light transparent substrate 1 is formed a non-single-crystal semiconductor layer member 4. The non-single-crystal semiconductor layer member 4 has an intrinsic non-single-crystal semiconductor layer 5 containing hydrogen or a halogen as recombination center neutralizer. The intrinsic non-single-crystal semiconductor layer 5 is formed of silicon (Si), germanium (Ge), Si$_x$Ge$_{1-x}$, or the like. The layer 5 has a thickness of, for example, 0.5 um.

The intrinsic non-single-crystal semiconductor layer 5 making up the non-single-crystal semiconductor layer member 4 is formed by a CVD method which does not employ a glow discharge technique, or a plasma CVD method which employs the glow discharge technique.

Figure 1:
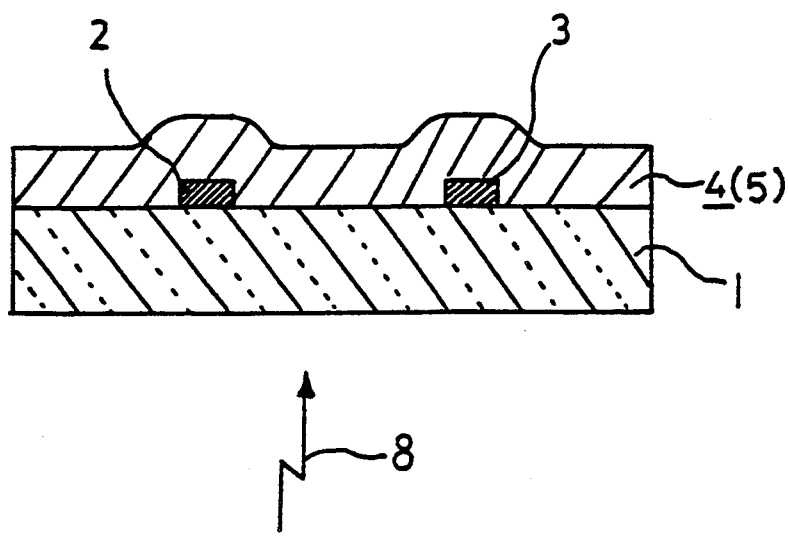
FIGS. 1, 2, 3 and 4 are schematic cross-sectional views respectively illustrating first, second, third and fourth embodiments of a semiconductor photo-electrically-sensitive device to which the present invention is applicable.

The second embodiment of the semiconductor photo-electrically-sensitive device shown in FIG. 2 has such a construction as follows:

The second embodiment of the semiconductor photo-electrically-sensitive device has the same structure as does the first embodiment of the semiconductor photo-electrically-sensitive device shown in FIG. 1 except that the conductive layers 2 and 4 are formed on the non-single-crystal semiconductor layer member 4. Therefore, no detailed description will be repeated.

The third embodiment of the semiconductor photoelectric conversion device shown in FIG. 3 has such a construction as follows:

A light transparent conductive layer 12 of tin oxide is formed, for example, by vacuum deposition on an insulating and light transparent substrate 1 of glass, fused quartz, synthetic quartz, or the like. On the conductive layer 12 is formed a lead 13 thereof.

On the light transparent conductive layer 12 is formed a non-single-crystal semiconductor layer member 4. The non-single-crystal semiconductor layer member 4 is formed by a sequential lamination of, for instance, a P-type non-single-crystal semiconductor layer 14, an intrinsic non-single-crystal semiconductor layer 5 containing hydrogen or a halogen as recombination center neutralizer, and an N-type non-single-crystal semiconductor layer 16. Accordingly, the non-single-crystal semiconductor layer member 4 has one intrinsic non-single-crystal semiconductor layer 5 and has formed therein one PIN junction. In this case, the P-type non-single-crystal semiconductor layer 14 is formed of silicon (Si), Si$_x$C$_{1-x}$(0,x,1, where x=0.8, for instance), germanium (Ge) or the like, and the layer 14 is, for instance, 100 A thick. When the P-type non-single-crystal semiconductor layer 14 is formed of silicon of Si$_x$C$_{1-x}$, the intrinsic non-single-crystal semiconductor layer 5 is formed of silicon or Si$_x$Ge$_{1-x}$, and when the layer 14 is formed of germanium, the layer 5 is also formed of germanium. The layer 5 has a thickness of, for example, 0.5 um. Further, when the intrinsic non-single-crystal semiconductor layer 5 is formed of silicon or $Si_xGe_{1-x}$, the N-type non-single-crystal semiconductor layer 16 is formed of silicon of $Si_xC_{1-x}$ (x=0.9, for example), and when the layer 5 is formed of germanium or $Si_xGe_{1-x}$, the layer 16 is also formed of germanium or $Si_xGe_{1-x}$. The N-type non-single-crystal semiconductor layer 16 is, for example, 200 Å in thickness.

The non-single-crystal semiconductor layers 14, 15 and 16 making up the non-single-crystal semiconductor layer member 4 are successively formed by the CVD method which does not employ the glow discharge technique, or a plasma CVD method which employs the glow discharge technique.

On the non-single-crystal semiconductor layer member 4 is formed, for example, by vacuum deposition on a reflecting conductive layer 17 as of aluminum (Al).

Figure 3:
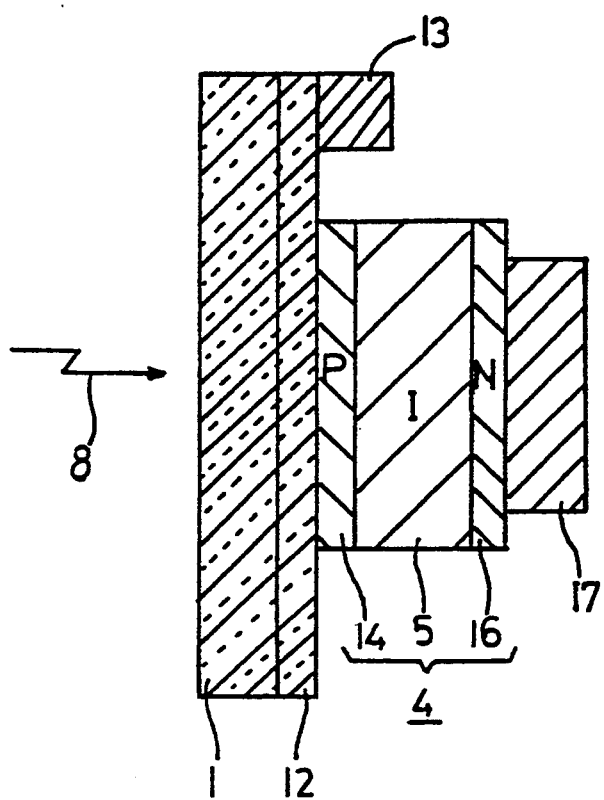

The fourth embodiment of the semiconductor photoelectric conversion device shown in FIG. 4 has such a construction as follows:

On a reflecting conductive substrate 21 as of stainless steel is formed the non-single-crystal semiconductor layer member 4 as is the case with the semiconductor photo-electrically-sensitive device shown in FIG. 3.

The non-single-crystal semiconductor layer member 4 is formed by a sequential lamination of the P-type non-single-crystal semiconductor layer 14, the intrinsic non-single-crystal semiconductor layer 5 containing hydrogen or a halogen as a recombination center neutralizer and the P-type non-single-crystal semiconductor layer 16 as is the case with the non-single-crystal semiconductor layer member 4 in FIG. 3. Accordingly, the non-single-crystal semiconductor layer member 4 has one intrinsic non-single-crystal semiconductor layer 5 and has formed therein one PIN junction as is the case with the non-single-crystal semiconductor layer member 4 in FIG. 3. The non-single-crystal semiconductor layer 14, 15 and 16 are also formed by such a CVD method as mentioned above.

On the non-single-crystal semiconductor layer member 4 is formed, for instance, by vacuum deposition a light transparent conductive layer 22 as of indium oxide containing tin oxide, which corresponds to the conductive layer 12 in FIG. 3.

Further, a conductive layer 23 for external connection is formed on the conductive layer 23.

Figure 2:
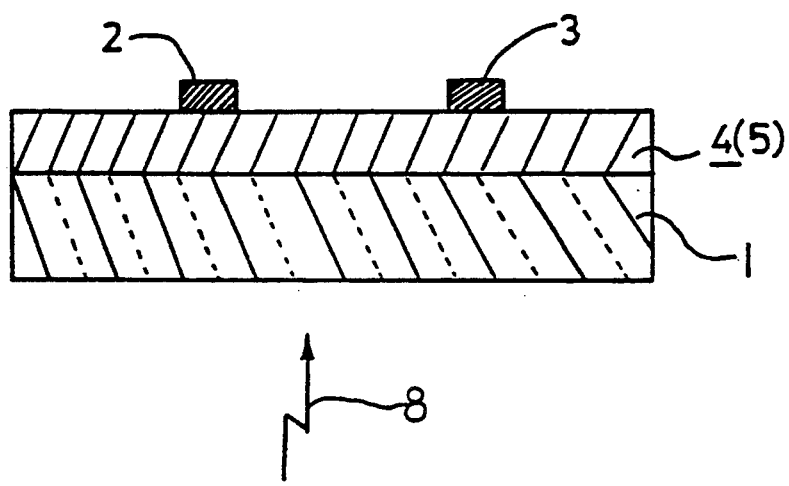

The first and second embodiments shown in FIGS. 1 and 2 are apparently identical in construction with a known semiconductor photo detector. The third and fourth embodiments of FIGS. 3 and 4 are apparently identical in construction with known semiconductor photoelectric conversion devices.

With each of the structures of the semiconductor photo-electrically-sensitive devices shown in FIGS. 1 and 2, when light 8 impinges on the device from the outside, the non-single-crystal semiconductor layer member 4 becomes conductive. Accordingly, if a load is connected across the conductive layer 2 and 3 through a power supply (not shown), power is supplied to the load.

With the structure of the semiconductor photo-electrically-sensitive device shown in FIG. 3, when light 8 impinges on the device from the outside of the substrate 11, it reaches the intrinsic non-single-crystal semiconductor layer 5 of the non-single-crystal semiconductor layer member 4, creating therein photo carriers. Accordingly, if a load is connected across the light transparent conductive layer 12 and the reflecting conductive layer 12, power is supplied to the load.

Figure 4:
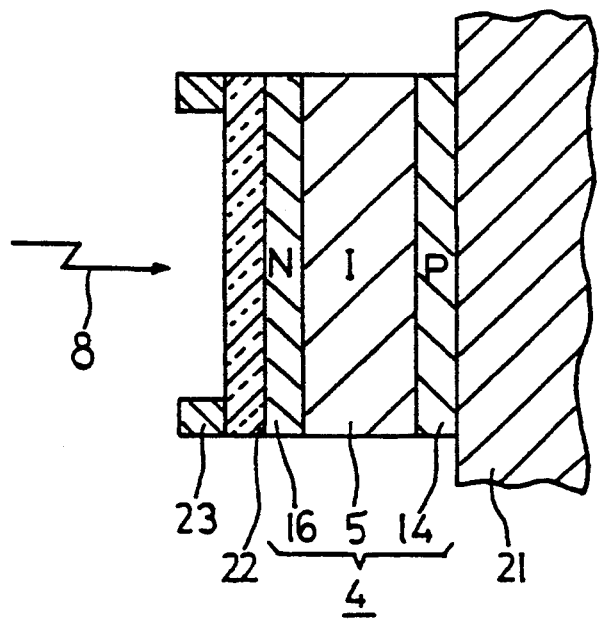

With the structure of the semiconductor photo-electrically-sensitive device of FIG. 4, the light 8 incident to the light transparent conductive layer 22 reaches the non-single-crystal semiconductor layer 5 of the non-single-crystal semiconductor layer member 4 to thereby generate therein photo carriers as is the case with the device shown in FIG. 3. Accordingly, if a load is connected across the reflecting conductive substrate 21 and the light transparent conductive layer 22, power is supplied to the load.

Where the transparent substrate 1 is an ordinary glass substrate, it contains sodium in large quantities, therefore, the intrinsic non-single-crystal semiconductor layer 5 of the non-single-crystal semiconductor layer member 4 formed by the CVD method on the substrate 1 inevitably contains sodium in large quantities. The same is true of the case where the substrate 1 is made of fused quartz as well. In this instance, however, since the sodium content in the substrate 1 is smaller than in the case of ordinary glass, the sodium content in the intrinsic non-single-crystal semiconductor layer is smaller than in the case of the substrate of the ordinary glass. It is to be noted that when the substrate 1 is made of synthetic quartz, since its sodium content is very small, the intrinsic non-single-crystal semiconductor layer formed thereon contains a very small amount of sodium.

Furthermore, when the intrinsic non-single-crystal semiconductor layer 5 of the semiconductor photo-electrically-sensitive device depicted in FIG. 1, 2, 3, or 4 is deposited by the CVD process, if sodium components stick to the inner walls of a reaction chamber used therefor (the substrate, the substrate holder and so on) the intrinsic layer 5 will inevitably contain sodium in large quantity.

When the intrinsic non-single-crystal semiconductor layer 5 of the non-single-crystal semiconductor layer member 4 is formed of silicon by the CVD method using, for example, silane ($SiH_4$) gas as a semiconductor material gas it inevitably contains oxygen. The reason is that it is extremely difficult to remove oxygen from the silane gas when it is prepared. Incidentally, commercially available silane gas of 99.99% purity usually contains oxygen about 0.1 ppm in the form of a simple substance ($O_2$) and about 3 ppm in the form of water ($H_2O$), carbon about 5 ppm in the form of methane ($CH_4$) and about 0.1 ppm in the form of ethane ($C_2H_6$), ethylene ($C_2H_4$), propane $C_3H_8$) and propylene ($_3H_6$) and phosphorus about 0.1 ppm in the form of phosphine ($PH_3$).

Further, when the intrinsic non-single-crystal semiconductor layer 5 of the non-single-crystal semiconductor laminate member 3 is formed of germanium by the CVD method using, for example, german ($GeH_4$) gas as the semiconductor material gas, the layer 5 inevitably contains oxygen because it is extremely difficult, in practice, to remove it from the german gas when it is prepared.

Moreover, when the intrinsic non-single-crystal semiconductor layer 5 of the non-single-crystal semiconductor laminate member 3 is formed of $Si_xGe_{1-x}$ by the CVD method using, as the semiconductor material gas, a mixture of silane and german gases, the layer 5 inevitably contains oxygen because it is extremely difficult, in practice, to prepare the silane and german gases with substantially no oxygen content.

In the conventional photoelectric device similar to those of FIGS. 1 to 2, the intrinsic non-single-crystal semiconductor layer 5 of the non-single-crystal semiconductor layer member 4 contains sodium and oxygen each in a high concentration exceeding $10^{20}$ atoms/cm$^3$.

In contrast thereto, according to the present invention, even if the intrinsic non-single-crystal semiconductor layer 5 of the non-single-crystal semiconductor laminate member 4 inevitably contains sodium and oxygen, the sodium and oxygen contents are each only $5 \times 10^{18}$ atoms/cm$^3$ or less.

The intrinsic non-single-crystal semiconductor layer with such a small sodium content can be formed by pretreating or cleaning the reaction chamber for removing therefrom sodium and by using a substrate containing only a negligibly small amount of sodium. If the sodium content in the substrate is relatively large, it is necessary only to pretreat or clean the substrate and the substrate holder for removing the sodium. The removal of sodium from the reaction chamber can be achieved in such a manner as follows: First, gas containing a chloride, for example, a gas mixture of oxygen and hydrogen chloride, is introduced into the reaction chamber and then the reaction chamber is heated at, for instance, about 1150° C. so that the gas reacts with the sodium to render it into NaCl gas. Thereafter, the reaction chamber is sufficiently evacuated.

The removal of sodium from the substrate and the substrate holder can be attained by the same method as described above, after placing them in the reaction chamber.

The intrinsic non-single-crystal semiconductor layer 5 with a small oxygen content can be formed by using, as the semiconductor material gas for forming the layer of silicon through the CVD method as mentioned above, silane gas which is obtained by passing raw silane gas of high purity through a passage in which is placed a molecular sieve having a mesh diameter of 2.7 to 4.65 A or zeolite having the same pore diameter so that the oxygen content of the silane gas may be reduced to substantially zero or negligibly small. The reason for which such silane gas with practically no or a negligibly small amount of oxygen can be obtained from the raw silane gas through use of the molecular sieve or zeolite, is as follows:

The effective molecular diameter of the silane is larger than 4.65 A and when oxygen is contained as of $O_2$ and $H_2O$ in the raw silane gas as referred to previously, their molecular diameters are in the range of from 2.7 to 4.65 A, so that the silane cannot pass through the meshes of the molecular sieve or the pores of the zeolite and hence is not absorbed on the molecular sieve or zeolite, whereas the oxygen and water contained in the raw silane gas pass through the meshes of the molecular sieve or the pores of the zeolite and are effectively absorbed thereon.

The oxygen content of such silane gas can be further reduced by passing it through a passage in which a deoxidizing agent is placed. By using the thus obtained silane gas, the oxygen content of the intrinsic non-single-crystal semiconductor layer 5 can be further reduced.

According to the present invention, the intrinsic non-single-crystal semiconductor layer 5 contains sodium in a low concentration of $5 \times 10^{18}$ atoms/cm$^3$ or less and oxygen in a low concentration of $5 \times 10^{15}$ atoms/cm$^3$ or less.

Therefore, according to the embodiments of the present invention shown in FIGS. 1 to 4, the photosensitivity of the intrinsic non-single-crystal semiconductor layer 5 is higher than the photosensitivity of the intrinsic non-single-crystal semiconductor layer of the conventional photo-electrically-sensitive device which contains each of sodium and oxygen in a high concentration of $10^{20}$ atoms/cm$^3$ or more.

FIGS. 5 to 8 show the above.

Figure 5:
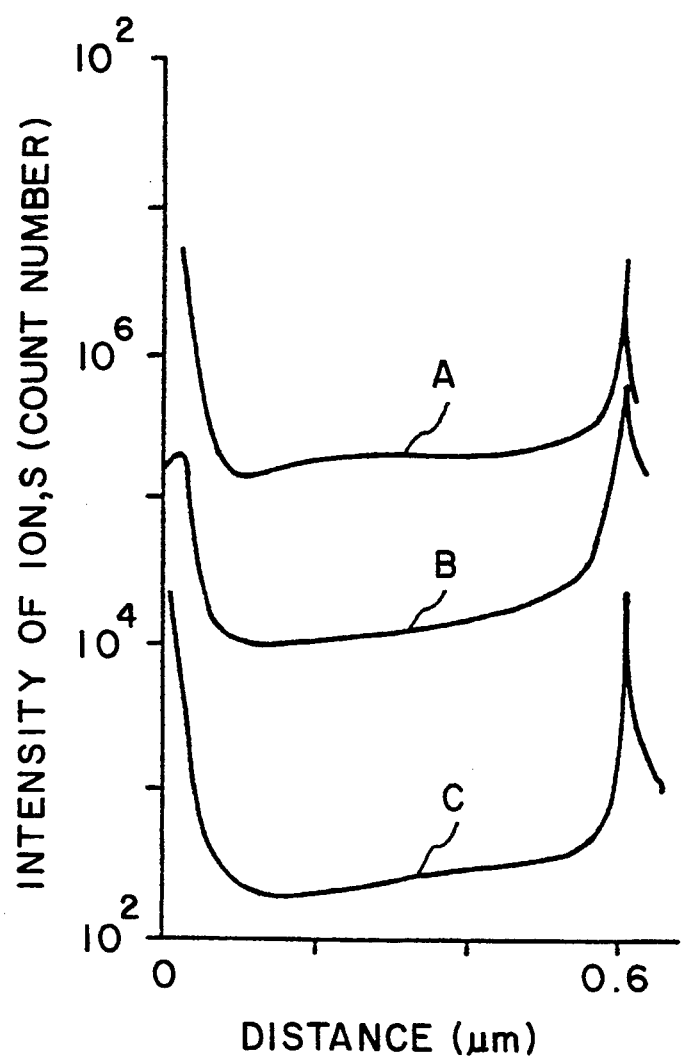
FIG. 5 is a diagram showing the distribution of sodium in the depthwise direction of the intrinsic non-single-crystal semiconductor layer of a non-single-crystal semiconductor layer member in the semiconductor photo-electrically-sensitive device depicted in FIGS. 1 to 4, using different kinds of substrates.
Figure 6:
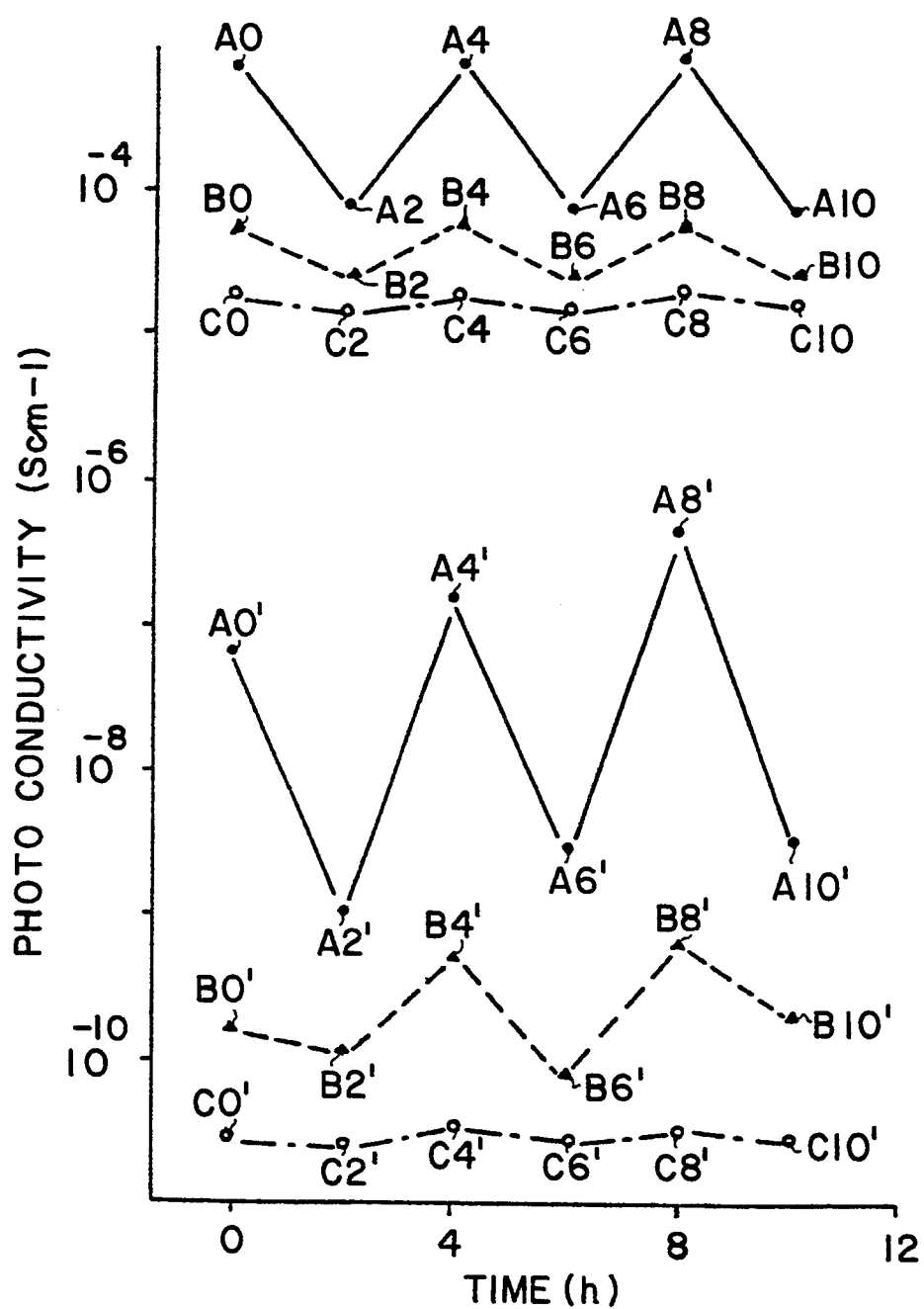
FIG. 6 is a diagram showing variations in the photosensitivity of the intrinsic non-single-crystal semiconductor layer of the non-single-crystal semiconductor layer member in the semiconductor photo-electrically-sensitive devices depicted in FIGS. 1 to 4 when the layer was irradiated by light and then heated, using different kinds of substrates.

That is to say, when the intrinsic non-single-crystal semiconductor layer 5 of the non-single-crystal semiconductor layer member 4 is deposited on an ordinary glass substrate of a large sodium content through the CVD method in the reaction chamber from which sodium has been removed according to the present invention, if the substrate has not been cleaned for removing sodium as referred to above, then sodium will be distributed in the intrinsic non-single-crystal semiconductor layer 5 depthwise thereof as indicated by the curve A in FIG. 5. Also in the case of similarly forming the layer 5 on a fused quartz substrate of a relatively large sodium content in the sodium-free reaction chamber, if the substrate has not been cleaned, then sodium will be distributed in the layer 5, as indicated by the curve B in FIG. 5. However, in the case of similarly forming the layer 5 on a synthetic quartz substrate of a very small sodium content through the CVD method in the cleaned reaction chamber, the layer 5 will have such a distribution of sodium as indicated by the curve C in FIG. 5.

Where the layer 5 has such a distribution of sodium as indicated by the curve A in FIG. 5, it presents such photo-conductivity as plotted by points A0, A2, A4 ... and such dark conductivity as plotted by points A0', A2', A4' ... in FIG. 6. The point A0 and A0' show the initial photo-conductivity and dark conductivity of the layer 5. The points A2 and A2' indicate photo-conductivity and dark conductivity after two hours of irradiation of the layer 5 by light under AM1 radiation condition (100 mW/cm$^2$) at room temperature. The points A4 and A4' show the photoconductivity and dark conductivity of the layer 5 heated at 150° C. for two hours thereafter. The points A6 and A6', A8 and A8' ... show similar photoconductivity and dark conductivity at respective points of time.

Where the intrinsic layer 5 has the sodium distribution indicated by the curve B in FIG. 5, it exhibits such photo-conductivity as plotted by points B0, B2, B4, ... corresponding to the above-mentioned A0, A2, A4, ... and such dark conductivity as plotted by points B0', B2', B4', ... corresponding to the above mentioned A0', A2', A4', ... in FIG. 6.

Where the intrinsic layer 5 has the sodium distribution indicated by the curve C in FIG. 5, it presents such photo-conductivity as plotted by points C0, C2, C4, ... . corresponding to the above-mentioned A0, A2, A4, ... . and such dark conductivity as plotted by points C0', C2', C4', . . . corresponding to the above-mentioned A0', A2°, A4°, ... in FIG. 6.

Figure 7:
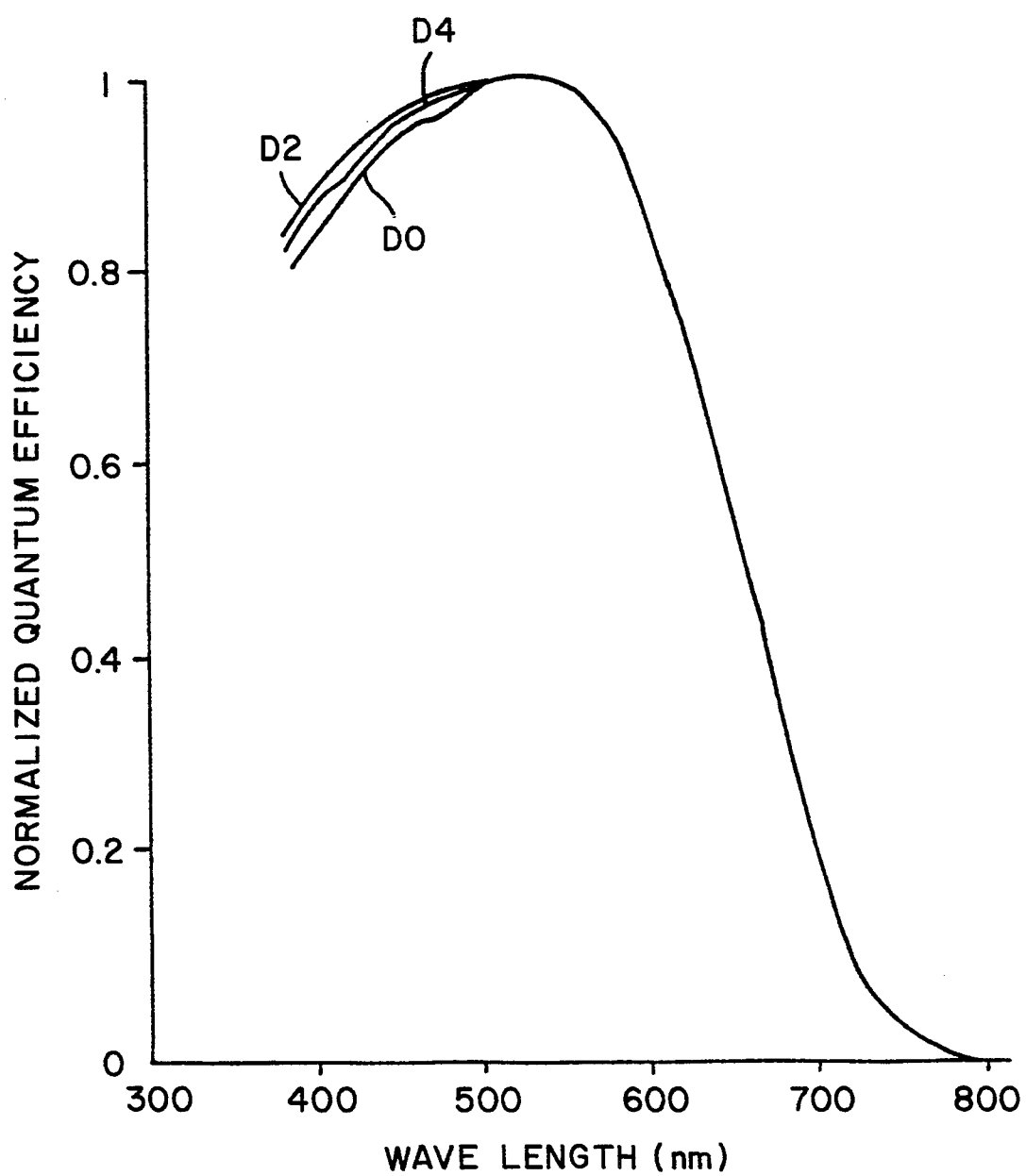
FIG. 7 is a diagram showing variations in rated quantum efficiency with respect to the wavelength of incident light in the semiconductor photo-electrically-sensitive devices depicted in FIGS. 3 to 4 when they were irradiated by light and then heated.
Figure 8:
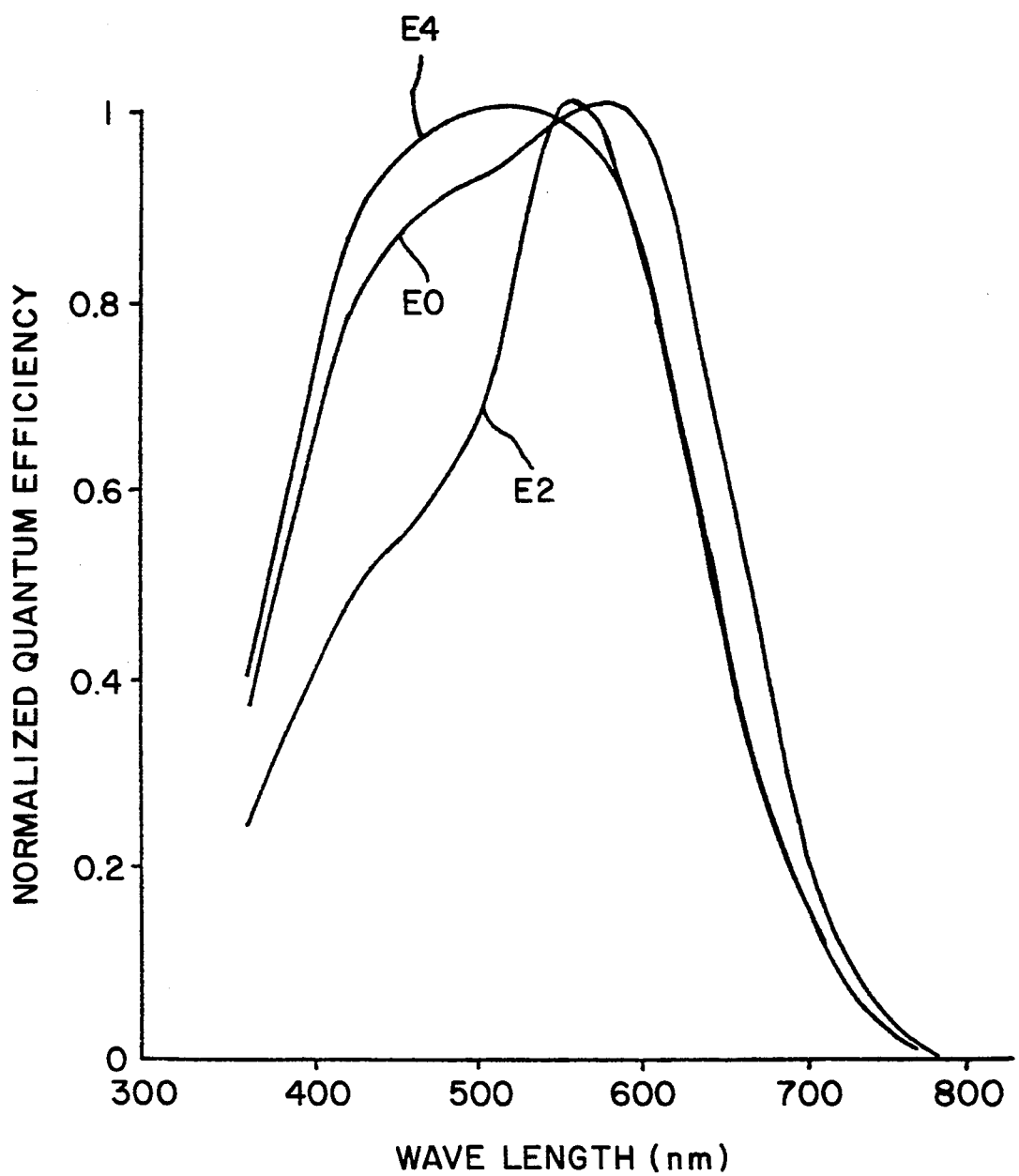
FIG. 8 is a diagram, similar to FIG. 7, showing variation in rated quantum efficiency in a conventional semiconductor photo-electrically-sensitive device which is seemingly identical in construction with the devices shown in FIGS. 3 and 4.

The values of photo-conductivity between the points A0 and A0', between A2 and A2', between A4 and A4', ... between the points B0 and B0', between B2 and B2', between B4 and B4', ... , and between C4 and C4', ... . respectively show photo-sensitivity. Furthermore, the value of photoconductivity A2 and A3, ... , between the points B0 and B2, between B2 and B3, and between the points C0 and C2, between C2 and C4, ... respectively show the deviation of the photo-conductivity.

Where the intrinsic layer 5 has such a sodium distribution as indicated by the curve C in FIG. 5 according to the present invention, the semiconductor photo-electrically-sensitive devices depicted in FIGS. 3 and 4 exhibits, relative to the wavelength of the incident light 8, such rated quantum efficiencies as indicated by the curves D0, D2, and D4 in FIG. 7. The curves D0, D2, and D4 respectively show rated quantum efficiencies in the cases corresponding to those where the points A0 and A0', A2 and A2', and A4 and A4' in FIG. 6 are obtained.

Where the intrinsic layer 5 has the sodium distribution indicated by the curve A in FIG. 5 not according to the present invention, the semiconductor photo-electrically-sensitive devices shown in FIGS. 3 and 4 present rated quantum efficiencies indicated by the curves E0, E2, and E4 in FIG. 8 respectively corresponding to the curves D0, D2, and D4 in FIG. 7.

In the above, no reference is made to the distribution of oxygen in the intrinsic layer 5, but when the layer 5 have oxygen distributions similar to the sodium distributions described above in regard to FIG. 5, the same results as referred to above in connection with FIGS. 6 to 8 can be obtained.

As will be appreciated from the above, according to the present invention the photo-sensitivity of the intrinsic layer 5 is very high and hardly changes even if heating is carried out after the irradiation by light.

While the present invention has been described as being applied to the semiconductor photo-electrically-sensitive device in which the non-single-crystal semiconductor layer member has a PIN or NIP type structure and, accordingly, it has formed therein one PIN or NIP junction, the present invention is also applicable to such a semiconductor photo-electrically-sensitive device in which the non-single-crystal semiconductor laminate member has an NI, PI, NIN or PIP type structure and, accordingly, it has formed therein at least one NI, PI, NIN or PIP junction.

Also the present invention is applicable to semiconductor photo-electrically-sensitive device of the type in which the non-single-crystal semiconductor layer member has, for example, an NIPIN or PINIP type structure and, accordingly, it has formed therein at least one PIN and NIP junction.

The semiconductor material formed in accordance with the present invention is applicable not only to the photoelectric conversion devices, but also to other semiconductor devices which utilize an intrinsic or substantially intrinsic non-single-crystalline semiconductor layer. Substantially intrinsic means that the semiconductor layer contains impurities having a valence of three or four for example B or P at a concentration of $1 \times 10^{18}$ atoms/cm$^3$ or less.

Figure 9:
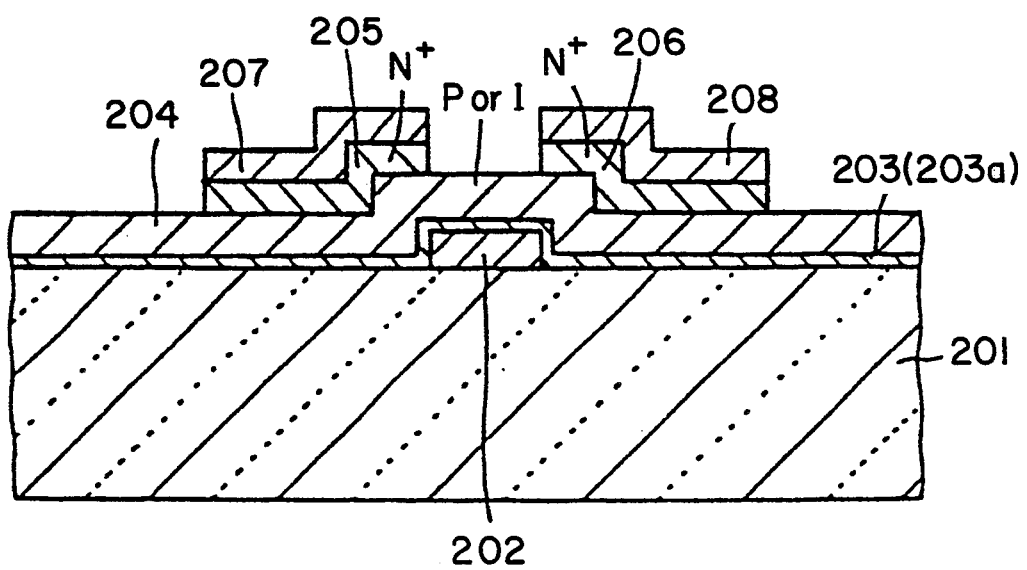
FIG. 9 is an example of an IG-FET having a non-single crystalline semiconducting material of an intrinsic or substantially intrinsic conductivity type.

An example of such semiconductor devices is an IG-FET as shown in FIG. 9. In the IG-FET of FIG. 9, a gate electrode 202 of the IG-FET is formed on a substrate 201 while the insulating layer 203 is formed over the substrate 201 and gate electrode 202. Formed on the insulating layer 203 is a semiconducting channel layer 204 and formed on the channel layer 204 is a semiconductor layer 205, 206 from which the source 205 and drain 206 are formed. In accordance with the present invention, the channel layer 4 comprises a non-single-crystalline semiconducting material of an intrinsic or substantially intrinsic conductivity type, which contains sodium or oxygen in a low concentration f only $5 \times 10^{18}$ atoms/cm$^3$ or less, respectively.

It will be apparent that many modifications and variations may be effected without departing from the scope of the novel concepts of the present invention.

I claim:

1. A non-single-crystalline semiconductor material comprising silicon of an intrinsic or substantially intrinsic conductivity type, wherein said semiconductor material is added with either or both of a halogen and hydrogen as a dangling bond neutralizer and wherein said material contains/sodium in a concentration of $5 \times 10^{18}$ atoms/cm$^3$ or less.

2. The semiconductor material of claim 1 wherein said material comprises a silicon semiconductor.

3. The semiconductor material of claim 1 wherein said semiconductor material contains an impurity having a valence of three or five at a concentration of $1 \times 10^{18}$ atoms/cm$^3$ or less.

4. The semiconductor material of claim 3 wherein said impurity is B or P.

5. A semiconductor device comprising:
a substrate having an insulating surface;
a non-single-crystal semiconductor layer formed on said substrate, said layer comprising an intrinsic or substantially intrinsic non-single-crystal silicon containing semiconductor in which hydrogen or halogen is added;
wherein said semiconductor layer contains sodium in a low concentration of only $5 \times 10^{18}$ atoms/cm$^3$ or less.

6. The semiconductor material of claim 1 wherein said material contains oxygen in a concentration of $5 \times 10^{18}$ atoms/cm$^3$ or less.

7. A semiconductor device comprising:
a substrate having an insulating surface; and
a non-single crystalline semiconductor layer of an intrinsic or substantially intrinsic conductivity type formed on said substrate;
wherein said semiconductor layer contains sodium in a low concentration of only $5 \times 10^{18}$ atoms/cm$^3$ or less.

8. The semiconductor device of claim 7 wherein a conductive layer is further formed on a surface of said non-single-crystalline semiconductor layer.

9. The semiconductor device of claim 7 wherein said semiconductor layer comprises a silicon semiconductor.

10. The semiconductor device of claim 7 wherein said semiconductor layer contains an impurity having a valence of three or five at a concentration of $1 \times 10^{18}$ atoms/cm$^3$ or less.

11. The semiconductor device of claim 10 wherein said impurity is B or P.

12. The semiconductor device of claim 7 wherein a halogen or hydrogen is added into said semiconductor layer as a dangling bond neutralizer.

13. The semiconductor device of claim 7 wherein said semiconductor layer contains oxygen in a concentration of $5 \times 10^{18}$ atoms/cm$^3$ or less.

14. In a semiconductor device formed on a substrate, which utilizes a non-single-crystalline semiconductor material comprising silicon of an intrinsic or substantially intrinsic conductivity type, said semiconductor material containing sodium in a low concentration of only $5 \times 10^{18}$ atoms/cm$^3$ or less and oxygen in a low concentration of only $5 \times 10^{18}$ atoms/cm$^3$ or less.

15. The semiconductor device of claim 7 wherein said semiconductor material comprises a silicon semiconductor.

16. The semiconductor device of claim 14 wherein said semiconductor material contains an impurity having a valence of three or five at a concentration of $1 \times 10^{18}$ atoms/cm$^3$ or less.

17. The semiconductor device of claim 16 wherein said impurity is B or P.

18. The semiconductor device of claim 14 wherein a halogen or hydrogen is added to said semiconductor layer as a recombination center.

19. The semiconductor device of claim 14 wherein said semiconductor material comprises at least the channel of an insulated gate, field effect transistor type semiconductor device.

* * * * *

UNITED STATES PATENT AND TRADEMARK OFFICE
CERTIFICATE OF CORRECTION

PATENT NO. : 5,391,893
DATED : February 21, 1995
INVENTOR(S) : Shunpei YAMAZAKI

It is certified that error appears in the above-indentified patent and that said Letters Patent is hereby corrected as shown below:

Column 9, line 67, change "$5 \times 10^{15}$" to --$5 \times 10^{18}$--.

Column 5, line 21, change "$5 \times 10^{15}$" to --$5 \times 10^{18}$--.

Column 11, line 53, change "valence of three or four" to --valence of three or five--.

Column 11, line 67, change "f" to --of--.

Signed and Sealed this

Third Day of March, 1998

BRUCE LEHMAN

*Attest:*

*Attesting Officer*     Commissioner of Patents and Trademarks